United States Patent
Xiao et al.

(10) Patent No.: US 8,759,762 B2
(45) Date of Patent: Jun. 24, 2014

(54) METHOD AND APPARATUS FOR IDENTIFYING PLUG-TO-PLUG SHORT FROM A CHARGED PARTICLE MICROSCOPIC IMAGE

(75) Inventors: Hong Xiao, Pleasanton, CA (US); Wei Fang, Milpitas, CA (US)

(73) Assignee: Hermes Microvision, Inc., Hsin-chu (TW)

( * ) Notice: Subject to any disclaimer, the term of this patent is extended or adjusted under 35 U.S.C. 154(b) by 329 days.

(21) Appl. No.: 12/483,220

(22) Filed: Jun. 11, 2009

(65) Prior Publication Data
US 2010/0314539 A1    Dec. 16, 2010

(51) Int. Cl.
*H01J 37/26* (2006.01)
*H01J 37/28* (2006.01)
*H01J 37/147* (2006.01)

(52) U.S. Cl.
CPC ............ *H01J 37/26* (2013.01); *H01J 37/28* (2013.01); *H01J 37/1474* (2013.01); *H01J 37/263* (2013.01)
USPC ........... 250/307; 250/306; 250/309; 250/310; 250/311

(58) Field of Classification Search
CPC ..... H01J 37/04; H01J 37/147; H01J 37/1474; H01J 37/26; H01J 37/263; H01J 37/28; H01J 37/30
USPC .......... 250/306, 307, 309, 310, 311; 382/168, 382/169, 170, 171, 172, 181, 199
See application file for complete search history.

(56) References Cited

U.S. PATENT DOCUMENTS

| | | | |
|---|---|---|---|
| 6,258,437 B1 * | 7/2001 | Jarvis ............................ | 428/137 |
| 7,453,274 B1 * | 11/2008 | Zhong et al. ............. | 324/762.01 |
| 2002/0031248 A1 * | 3/2002 | Maed et al. ................... | 382/149 |
| 2008/0250384 A1 * | 10/2008 | Duffy et al. ..................... | 716/21 |
| 2008/0260236 A9 * | 10/2008 | Ishikawa et al. .............. | 382/149 |
| 2008/0315088 A1 * | 12/2008 | Takahashi et al. ............ | 250/306 |

* cited by examiner

*Primary Examiner* — Nicole Ippolito
(74) *Attorney, Agent, or Firm* — WPAT, PC; Justin King

(57) ABSTRACT

A method of inspecting for plug-to-plug short (short circuit) defects on a sample is disclosed. A charged particle beam for imaging the sample is repeatedly line-scanned over the sample with a line-to-line advancement direction perpendicular to the line-scan direction. The method includes scanning the sample with a line-to-line advancement along a first and a second direction, to obtain a first and a second image of the sample, respectively. Then, the method includes identifying plug patterns, represented in the obtained images with abnormal grey levels, as abnormal plug patterns. Next, the method compares the locations of the abnormal plug patterns to determine the presence of plug-to-plug short defects on the sample.

20 Claims, 11 Drawing Sheets

METHOD AND APPARATUS FOR IDENTIFYING PLUG-TO-PLUG SHORT FROM A CHARGED PARTICLE MICROSCOPIC IMAGE

BACKGROUND OF THE INVENTION

1. Field of the Invention

The present invention is generally related to a method and apparatus for identifying a plug-to-plug short (short circuit) from a charged particle microscopic image, and more particularly to a method and apparatus for identifying a plug-to-plug short as an abnormal voltage contrast (VC).

2. Description of the Prior Art

During charged particle beam inspection of a sample of a semiconductor device, a charged particle microscopic image is formed from secondary charged particles released by the sample while it is bombarded with a primary charged particle beam. In the obtained image, patterns on the sample are typically displayed in grey levels. By analyzing this grey level image of the sample, the presence of defects, i.e., abnormal physical and electrical characteristics of the sample, can be represented in the form of voltage contrast (VC).

In the manufacture of a semiconductor device, narrow gaps between conductive metal lines often give rise to voids or keyholes during the dielectric deposition process. When this happens, metal filler such as titanium (Ti), titanium nitride (TiN) and tungsten (W) deposits into the keyholes and causes shorts (short circuits) between neighboring metal plugs. This yield-impacting defect is commonly called a plug-to-plug short defect. In some cases, it is called the "piping" defect, as well. The piping plugs are generally found between two parallel lines underneath the surface of the sample. FIG. 1 illustrates a plug-to-plug short defect, as represented schematically in the context of a top view image 100 of a semiconductor device comprising plugs 101 and metal lines 102. Reference number designators 110 and 120 identify cross-sectional views along line A-A' and line B-B' of image 100, respectively. A plug-to-plug short defect 103 causes an undesired connection between neighboring plugs 101. As shown, plug-to-plug short defect 103 can involve two or three plugs 101.

Currently, to inspect for the presence of this defect in real time, in-line monitoring with a charged particle scanning microscope is typically employed. The imaging process is typically performed by repeatedly line-scanning a charged particle beam over the sample with a line-to-line advancement direction substantially perpendicular to the line-scan direction. This scan mode is generally referred to as the raster scan. As a result, a two-dimensional (2D) array of scan lines is formed on the sample, and a grey level image of the sample is thus obtained therefrom.

For a long "string" type of plug short caused by long keyhole, long string bright voltage contrast (BVC) between tungsten (W) plugs has been observed, typically standing out from the environmental darker voltage contrast (DVC) pixels.

However, when inspecting piping between neighboring plugs in a grey level image, especially when the defective plugs are aligned on an axis parallel to the line-to-line advancement direction, the defective plugs often appear as one slight BVC plug pattern neighbored by one or more normal, slightly dark, or less bright DVC plug patterns. FIG. 2 is a schematic illustration of a plug-to-plug short defect and leakage defect in a grey level image. With reference to the top half of this figure, a plug-to-plug short defect 201 is illustrated in image 200(a), and a leakage defect 202 is illustrated in image 200(b). As shown in this example, plug-to-plug short defect 201 displays successive plug patterns with the left one in BVC and the right one in DVC, while leakage defect 202 displays a single BVC. It can be seen from images 200(a) and 200(b) that the plug-to-plug short defect 201 is not distinct from the leakage defect 202 because in both cases only one single BVC is clearly observed. The line-scan direction and line-to-line advancement direction for forming images 200(a) and 200(b) are illustrated by arrows 210 and 212 (which, in this example, is from left to right), respectively.

This is mainly because when the first defective plug of the plug-to-plug short defect 201 along the line-to-line advancement direction 212 (which is the left plug pattern) is encountered and scanned, most free electrons in the other defective plug (which is electrically connected to the scanned plug through piping) are attracted by the accumulated positive charging on the surface of the scanned plug and, thus, move to the scanned plug. As a result, the accumulated charging on the scanned plug is neutralized, causing it to display BVC in the obtained grey level image. When the next plug (which is the right plug pattern) is scanned, as most of its free electrons are gone by the moment of scanning, positive charging will accumulate on its surface. Therefore, this latter scanned plug displays normal (darker) VC or DVC in the obtained grey level image. This makes it difficult to identify (distinguish) these defective plug patterns as consecutive BVCs, as compared to single BVCs resulting from, for example, a leakage defect.

The same confusion may appear in a three-plug piping situation, as well. With reference to the bottom half of FIG. 2, image 200(c) illustrates such a case where, again, the three defective piping plug patterns 201 are aligned with each other and an axis parallel to the line-to-line advancement direction 212 (which, in this example, is from right to left). In such a case, only the first defective plug pattern (which, this time, is the one on the right) in the line-to-line advancement direction 212 of scan can be easily observed as a BVC in the grey level image. The other two plug patterns may just look normal (darker VC). Therefore, by comparison with image 200(d) which illustrates a leakage defect 202 displaying a single BVC, it can be seen that the plug-to-plug short defect 201 is still difficult to be distinguished (e.g., not easily or readily distinguishable) from the leakage defect 202.

Accordingly, a method for improving the contrast between these two types of defects in a grey level image is desired.

SUMMARY OF THE INVENTION

A method of inspecting for plug-to-plug short (short circuit) defects on a sample of a semiconductor device by charged particle beam imaging is disclosed. In imaging, a charged particle beam is repeatedly line-scanned over the sample with a line-to-line advancement direction perpendicular to the line-scan direction.

The disclosed method comprises scanning the sample with line-to-line advancement along a first direction thereby obtaining a first grey level image of the sample, and scanning the sample with line-to-line advancement along a second direction thereby obtaining a second grey level image of the sample, wherein the first and second images represent grey levels of a plurality of plug patterns on the sample. Then, the plug patterns with abnormal grey levels (i.e. and/or e.g., "abnormal plug patterns") are identified in the first and second images, respectively. Next, the locations of the identified abnormal plug patterns in the first and second images are compared to determine the presence of a plug-to-plug short defect on the sample.

The objective, technologies, features and advantages of the present invention will become apparent from the following description in conjunction with the accompanying drawings which set forth, by way of illustration and example, certain embodiments of the present invention.

BRIEF DESCRIPTION OF THE DRAWINGS

The conceptions and accompanying advantages of this invention will become more readily appreciated and better understood by referring to the following detailed description in conjunction with the accompanying drawings, wherein.

DESCRIPTION OF THE PREFERRED EMBODIMENT

A detailed explanation of the present invention is provided in the context of preferred embodiments which are for purposes of illustration and examples of the present invention and which are not intended to limit the scope of the present invention.

Embodiments of the present invention disclose a method to distinguish a plug-to-plug short (short circuit) defect from a leakage defect in a grey level image of a sample, which may comprise, for example, a NOR flash memory device, a dynamic random access memory (DRAM) device, or a static random access memory (SRAM) device. The image is formed through multi-directional scans of the imaging charged particle beam over the sample. The sample has at least a plurality of plug patterns thereon.

Figure 3:
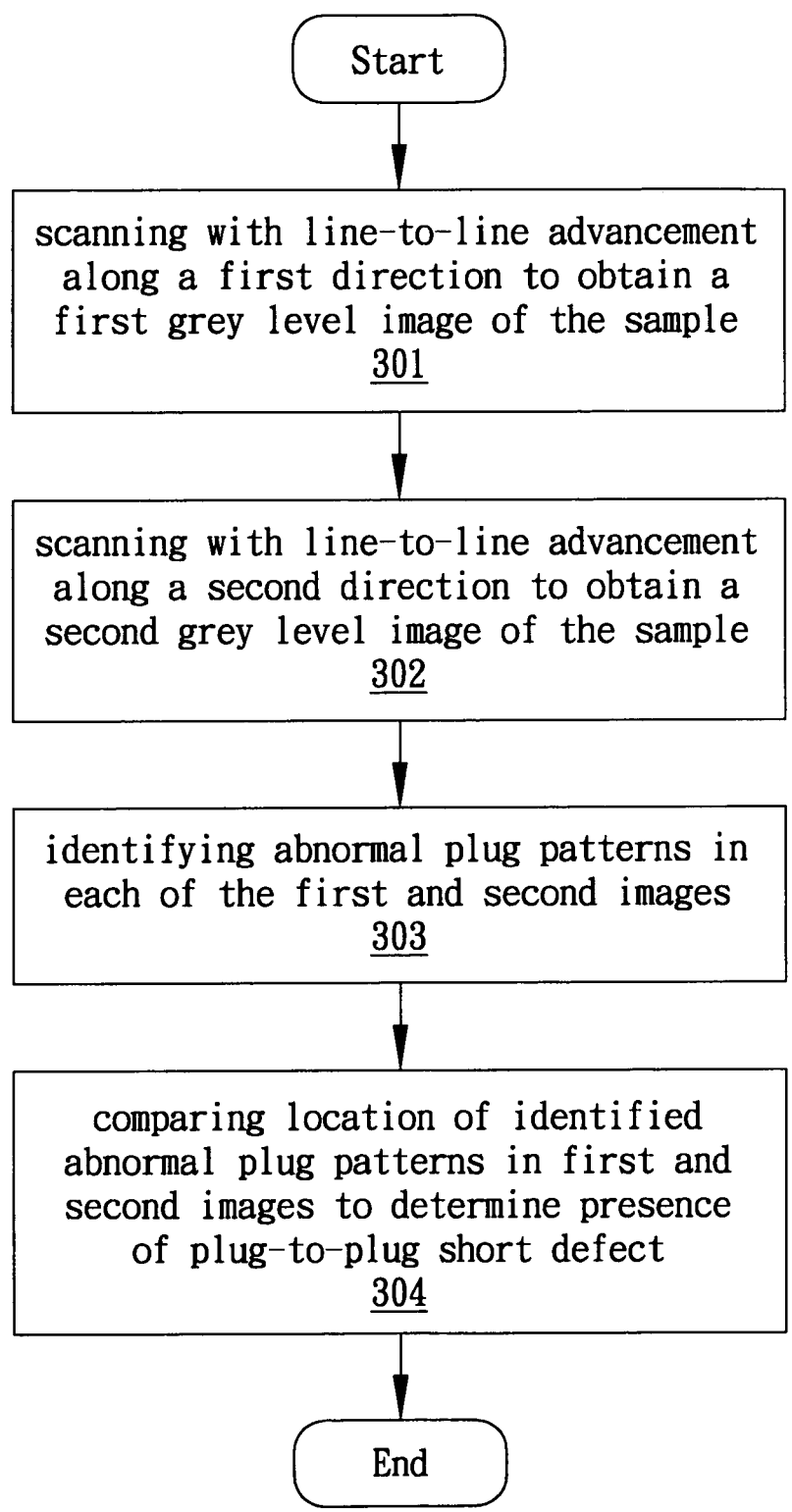
FIG. 3 is a flowchart illustrating a method of inspecting for plug-to-plug short defects in accordance with an embodiment of the present invention.

Referring to the drawings, FIG. 3 is a flowchart illustrating a method of inspecting for plug-to-plug short defects in accordance with an embodiment of the present invention. The sample is first scanned with line-to-line advancement along a first direction, and a first grey level image of the sample is thus obtained (step 301). Then, the sample is scanned with line-to-line advancement along a second direction, and a second grey level image of the sample is obtained (step 302). Next, in each of the first and second images, plug patterns with abnormal grey levels (i.e. and/or e.g., abnormal plug patterns) are identified (step 303). Not wishing to be limited, these identified plug patterns will be referred to as "abnormal plug patterns" hereinafter for convenience. Finally, the locations of the identified abnormal plug patterns in the respective first and second images are compared, so as to determine (detect) the presence of one or more plug-to-plug short defects on and/or underneath the surface of the sample (step 304). Details of the disclosed method will be described below in conjunction with corresponding drawings.

Figure 4:
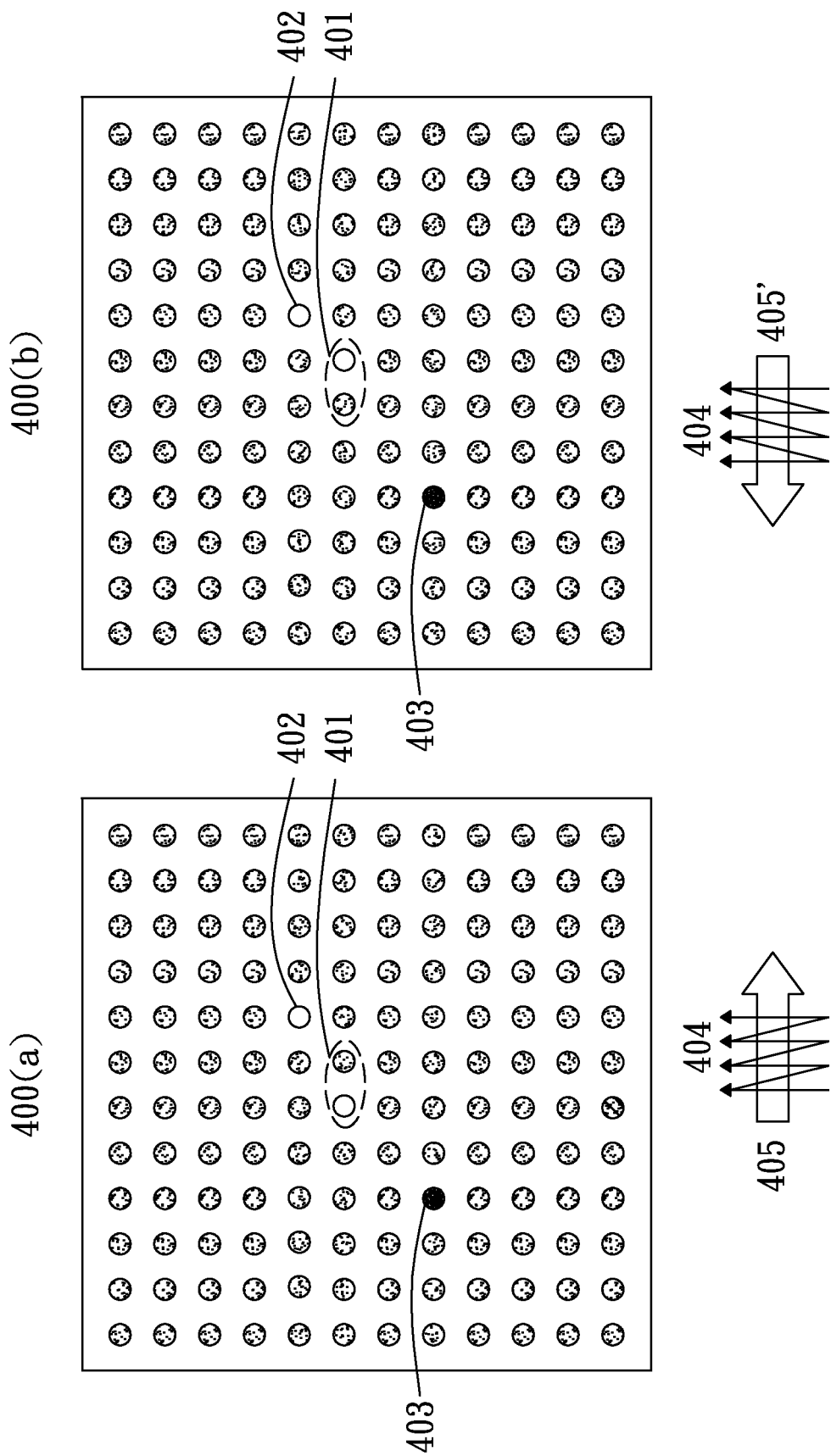
FIG. 4 is a schematic representation of multi-directional charged particle beam imaging of an inspection area in accordance with an embodiment of the present invention.

FIG. 4 is a schematic representation of multi-directional charged particle beam imaging of an inspection area in accordance with an embodiment of the present invention. As shown, grey level images $400(a)$ and $400(b)$ are presented for inspection (e.g., being inspected). Image $400(a)$ is formed by scanning a charged particle beam over the inspection area on a sample with a line-scan direction 404 and a line-to-line advancement direction 405. On the other hand, image $400(b)$ is formed by scanning the charged particle beam over the inspection area with the same line-scan direction 404 and a line-to-line advancement direction 405'. As shown in this embodiment, line-to-line advancement directions 405 and 405' are parallel but opposite to each other.

Images $400(a)$ and $400(b)$ are observed to comprise a plug-to-plug short (piping) defect 401, a leakage defect 402, and an open defect 403, wherein plug-to-plug short defect 401 displays a bright voltage contrast (BVC) with a neighboring darker (e.g., more normal or slightly dark) voltage contrast (DVC), leakage defect 402 displays a single BVC, and open defect 403 displays a DVC. Defects 401, 402 and 403, when displayed in images $400(a)$ and $400(b)$, are the aforementioned abnormal plug patterns.

Identification of the abnormal plug patterns in a grey level image can be realized in many ways. For example, the first and second images can be respectively compared with a database layout of the sample. This database layout may be one or more of a Graphic Data System (GDS) file of the sample, an Open Artwork System Interchange Standard (OASIS) file of the sample, etc., or any combination thereof. Alternatively, the first and second images may be respectively compared with a grey level image of a reference semiconductor device which has the same layout of patterns as the sample of interest. For example, this reference device may be known to be defect-free. As another alternative approach, the first and second images may be respectively compared with a predefined reference grey level image which represents the same layout of patterns as the sample of interest. For example, this reference image is known to be defect-free. Such reference image may be formed by synthesizing one or more grey level images of the same layout of patterns of the sample of interest, wherein only the defect-free portions in each image are adopted.

Figure 5A:
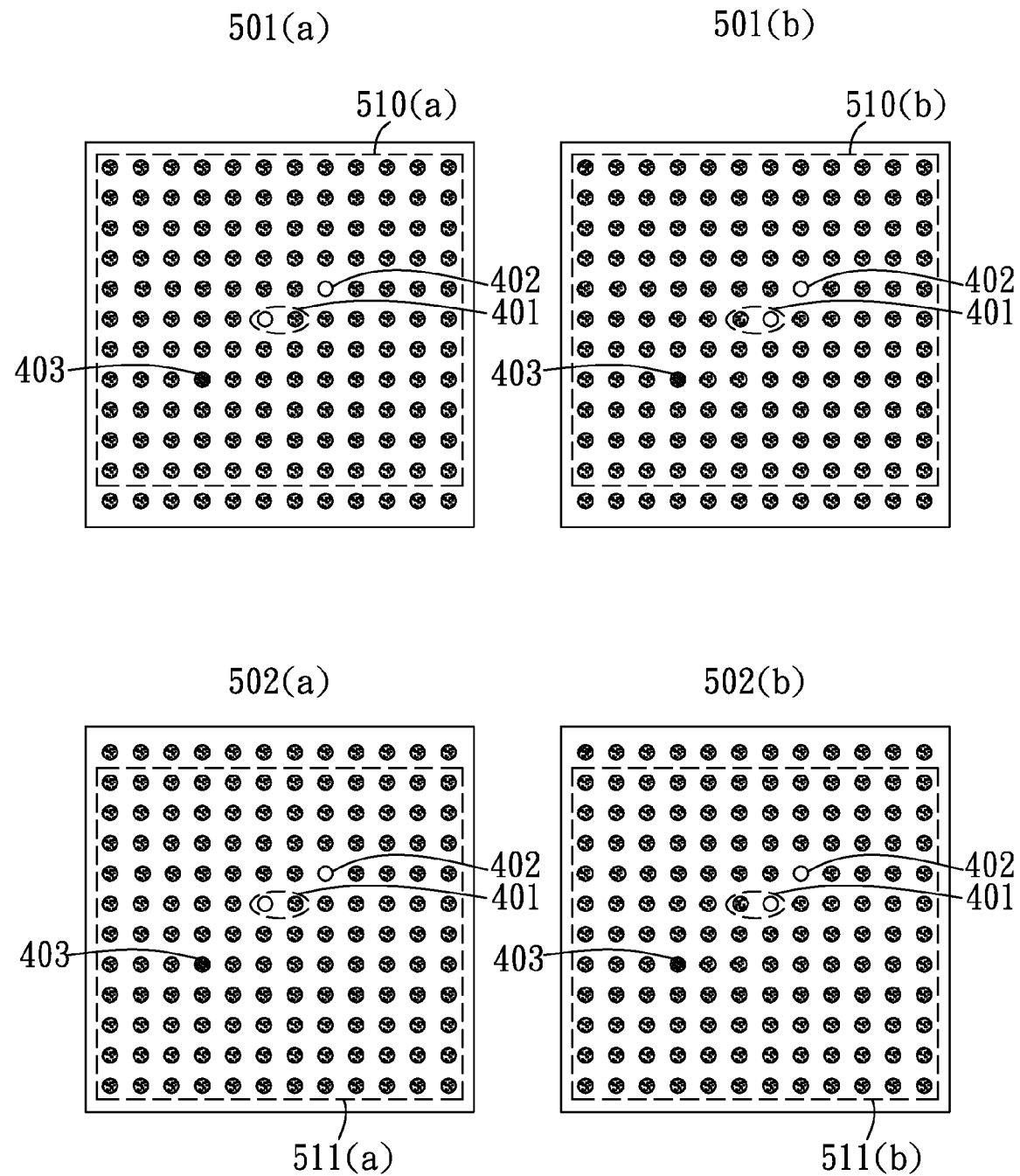
FIG. 5A and FIG. 5B are schematic representations of a method of inspecting for plug-to-plug short defects in accordance with an embodiment of the present invention.
Figure 5B:
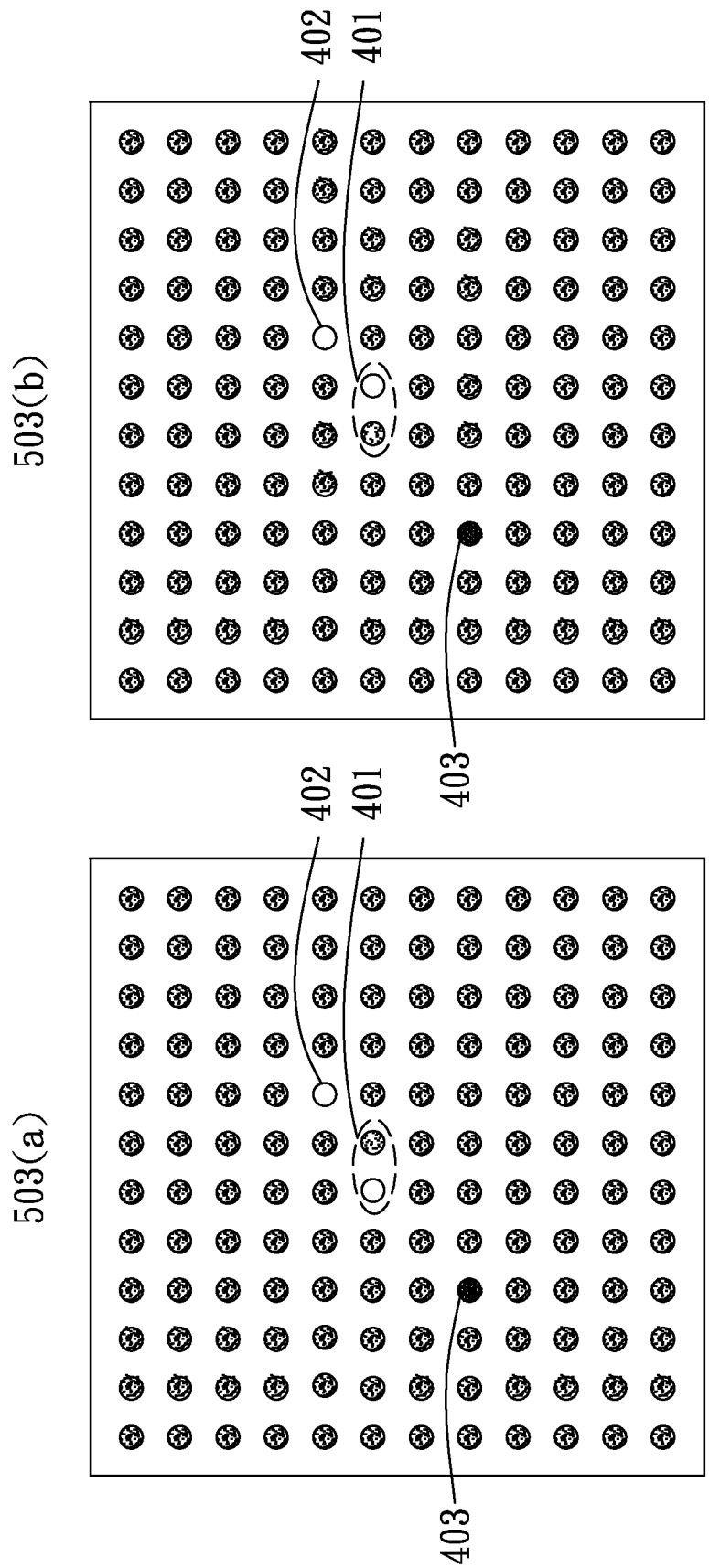

In one embodiment, the identification of defects 401, 402 and 403 from images $400(a)$ and $400(b)$ is carried out through comparison of specially selected group(s) of repeating plug patterns against each other. Referring to FIG. 5A and FIG. 5B, which are schematic representations of a method of inspecting for plug-to-plug short defects in accordance with an embodiment of the present invention, two sets of repeating plug patterns are first selected within each of the images $400(a)$ and $400(b)$. For example, plug pattern sets $510(a)$ and $511(a)$ are respectively selected within image $400(a)$ as shown in images $501(a)$ and $502(a)$ of FIG. 5A. Similarly, plug pattern sets $510(b)$ and $511(b)$ are respectively selected within image $400(b)$ as shown in images $501(b)$ and $502(b)$ of FIG. 5A. Then, the two sets of repeating plug patterns are compared against each other (e.g., pixel by pixel). For example, plug pattern sets $510(a)$ and $511(a)$ are compared against each other, pixel by pixel, to identify the presence of defects in image 400(a). Similarly, plug pattern sets 510(b) and 511(b) are compared against each other, pixel by pixel, to identify the presence of defects in image 400(b). The comparison results are illustrated in images 503(a) and 503(b) of FIG. 5B. As shown in image 503(a), defects 401, 402 and 403 are found within image 400(a). As shown in image 503(b), defects 401, 402 and 403 are found within image 400(b). This identification method is typically referred to as the Array Mode inspection.

It will be understood by those with ordinary skill in the art that the aforementioned defect identification methods are nothing more than imaging processing approaches commonly used in the industry for determining the presence of defects from a charged particle grey level image. The purpose of using these methods is to achieve single-image defect inspection for each of the two images, 400(a) and 400(b), obtained from steps 301 and 302 of the flow chart in FIG. 3. Next, the inspection results will be further processed for determination of the presence of plug-to-plug shorts on the sample, as will be described below.

As illustrated, inspection of images 400(a) and 400(b) produces resultant images 503(a) and 503(b). In images 503(a) and 503(b), defects appear as abnormal VC. For example, as shown, plug-to-plug short defect 401 displays a BVC with a neighboring DVC; leakage defect 402 displays a single BVC; and open defect 403 displays a DVC. It can be seen that defects 401 and 402 look similar in the respective images 400(a) and 400(b), because the DVC portion of defect 401 makes it look like a single BVC. Recall that in the conventional art, inspection for the presence of plug-to-plug short defects 401 is performed directly on either image 400(a) or 400(b). In the present invention, however, to more conveniently and correctly distinguish plug-to-plug short defect 401 from leakage defect 402, images 503(a) and 503(b) are processed to enhance differences between the VCs of defects 401 and 402.

Figure 6:
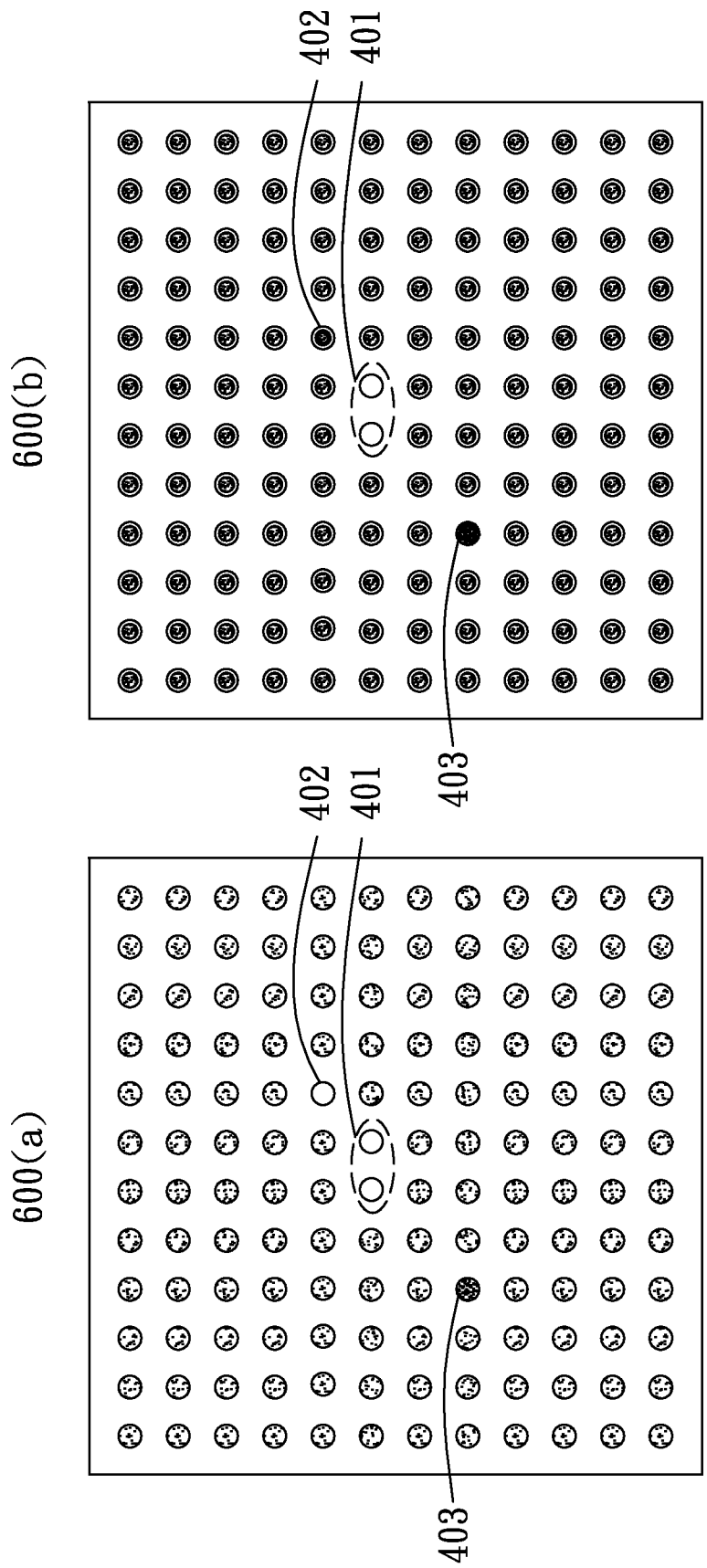
FIG. 6 is a schematic illustration corresponding to a method of inspecting for plug-to-plug short defects in accordance with another embodiment of the present invention.

FIG. 6 is a schematic representation of a method of inspecting for plug-to-plug short defects in accordance with an embodiment of the present invention. Image 600(a) is produced by linearly adding images 503(a) and 503(b), and image 600(b) is produced by linearly subtracting one of images 503(a) and 503(b) from the other. As shown, in either image 600(a) or 600(b), defect 401 now appears as two successive BVCs.

In other words, the single BVCs in the imaged plug-to-plug short defect 401 from respective images 503(a) and 503(b) are in fact located next to each other on the sample, therefore, when the two images are combined, defect 401 appears as two BVCs standing together. As shown in image 600(b), by subtraction of images, single BVCs displayed by leakage defect 402 in images 503(a) and 503(b) cancels each other and are no longer observable. Plug-to-plug short defect 401, however, is clearly seen in image 600(b), as subtraction of a DVC from a BVC substantially results in a BVC. Therefore, image 600(b) is suitable for inspection of the sample for plug-to-plug short defects. On the other hand, in image 600(a), while leakage defect 402 still appears as one single BVC, plug-to-plug short defect 401 now appears as a pair of BVCs standing together, as addition of a BVC and a DVC still gives an observable BVC. Therefore, the presence of plug-to-plug short defect 401 can now be correctly determined, but no longer confused by the presence of the leakage defect 402.

Figure 1:
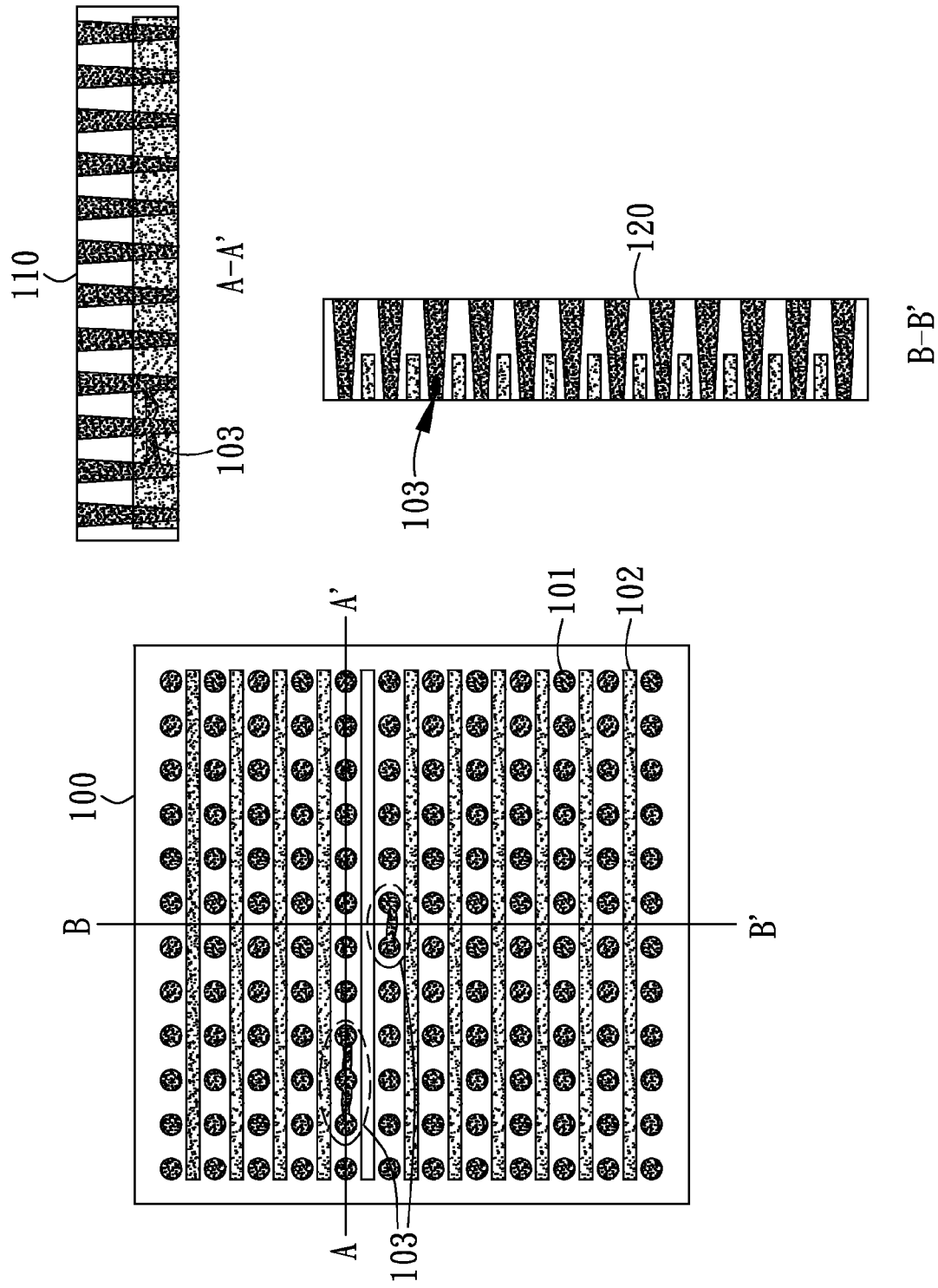
FIG. 1 is a schematic illustration of a plug-to-plug short (short circuit) defect.
Figure 2:
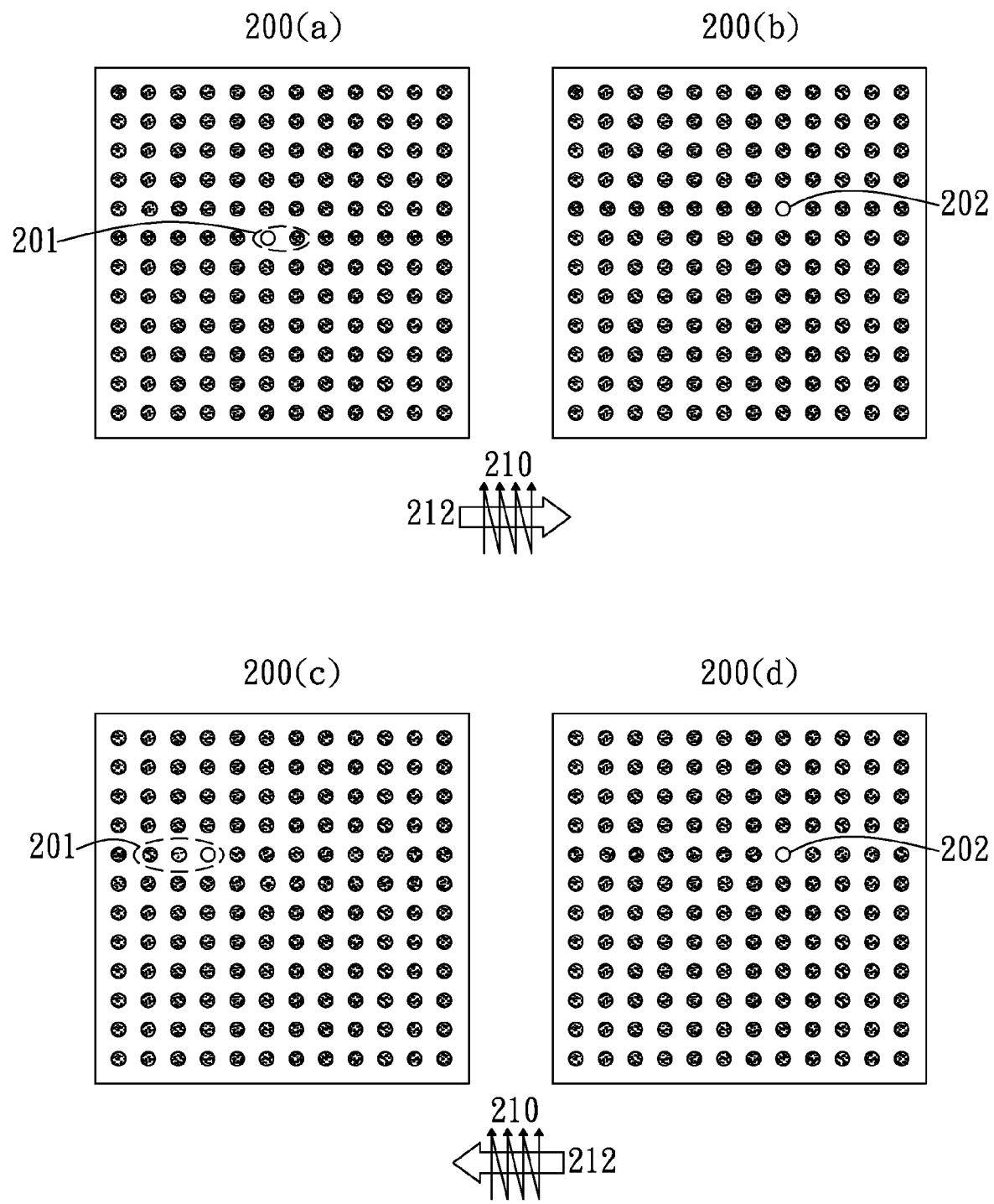
FIG. 2 is a schematic illustration of a plug-to-plug short defect and leakage defect in a grey level image.
Figure 7:
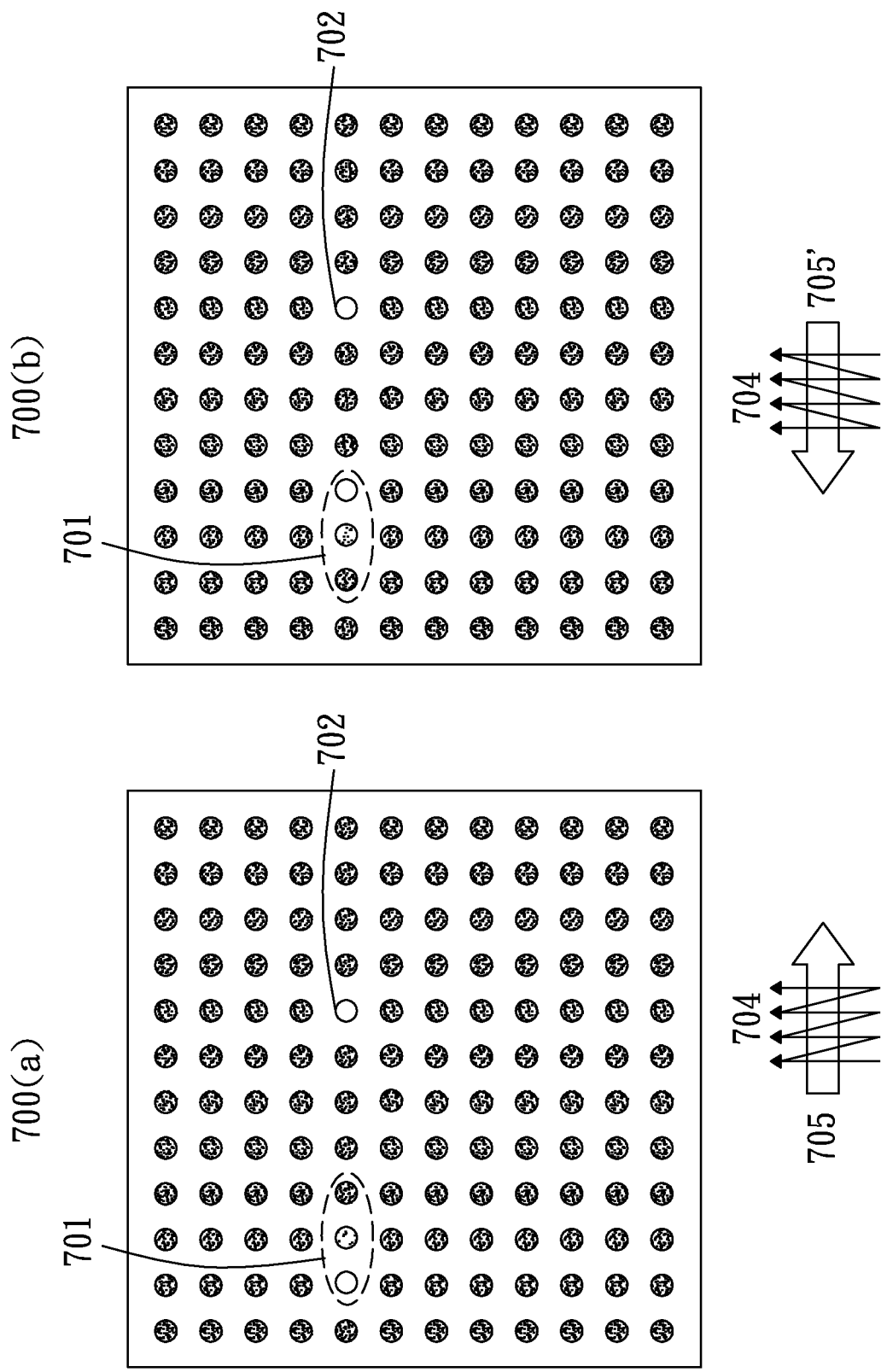
FIG. 7 is a schematic illustration reflecting a method of inspecting for plug-to-plug short defects in accordance with a further embodiment of the present invention.

As mentioned earlier, the same confusion may be seen in a three-plug piping, as illustrated in image 200(c) of FIG. 2. For such case, similar approach as described in conjunction with FIG. 3 to FIG. 6 still applies. FIG. 7 is a schematic representation of a method of inspecting for plug-to-plug short defects in accordance with an embodiment of the present invention. First, images of the sample are obtained through multi-directional scanning of the sample, as illustrated by images 700(a) and 700(b). The line-scan direction and line-to-line advancement direction are illustrated by arrows 704 and 705/705', respectively. As illustrated, image 700(a) comprises a plug-to-plug short defect 701 and a leakage defect 702. On the other hand, image 700(b) also comprises defects 701 and 702. As shown, at least the first scanned plug in defect 701 would be observed to display BVC in each image. In this embodiment, the second scanned plug in defect 701 displays observable BVC, as well, but it is not necessarily always true. For example, the second plug pattern may display a DVC that looks substantially normal, as well. Then, image inspection is respectively performed to each of the images 700(a) and 700(b) to identify the presence of defects 701 and 702.

Figure 8:
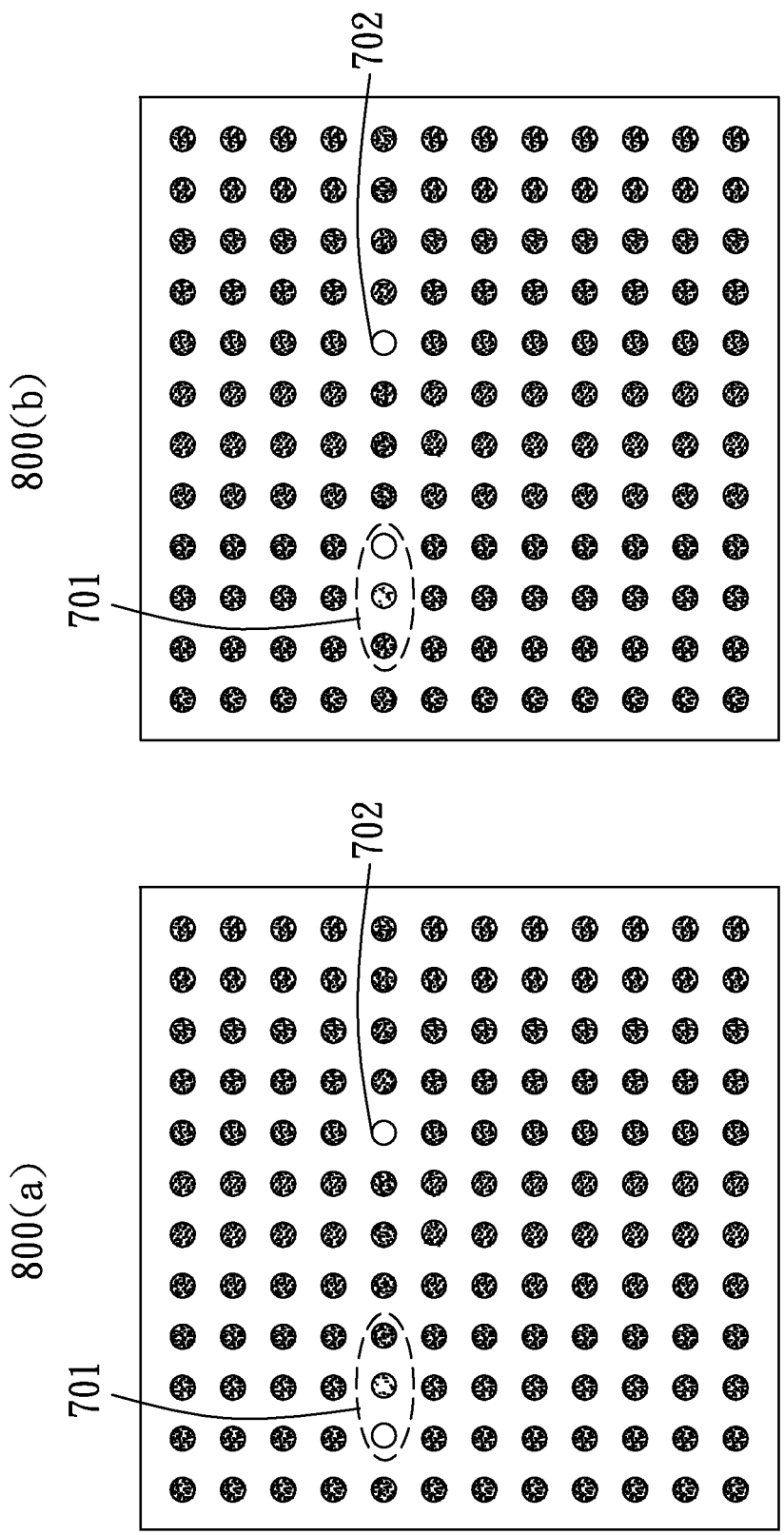
FIG. 8 illustrates resultant images produced from image processing the images of FIG. 7.

As can be seen in FIG. 8, which depicts resultant images 800(a) and 800(b) produced by imaging inspection of respective images 700(a) and 700(b), images 800(a) and 800(b) are similar to images 503(a) and 503(b) of FIG. 5B. As illustrated, image 800(a) is observed to comprise plug-to-plug defect 701 and leakage defect 702. On the other hand, image 800(b) is also observed to comprise defects 701 and 702. Next, images 800(a) and 800(b) are combined to locate the plug-to-plug short defect 701, or to enhance the difference between plug-to-plug short defect 701 and leakage defect 702.

Figure 9:
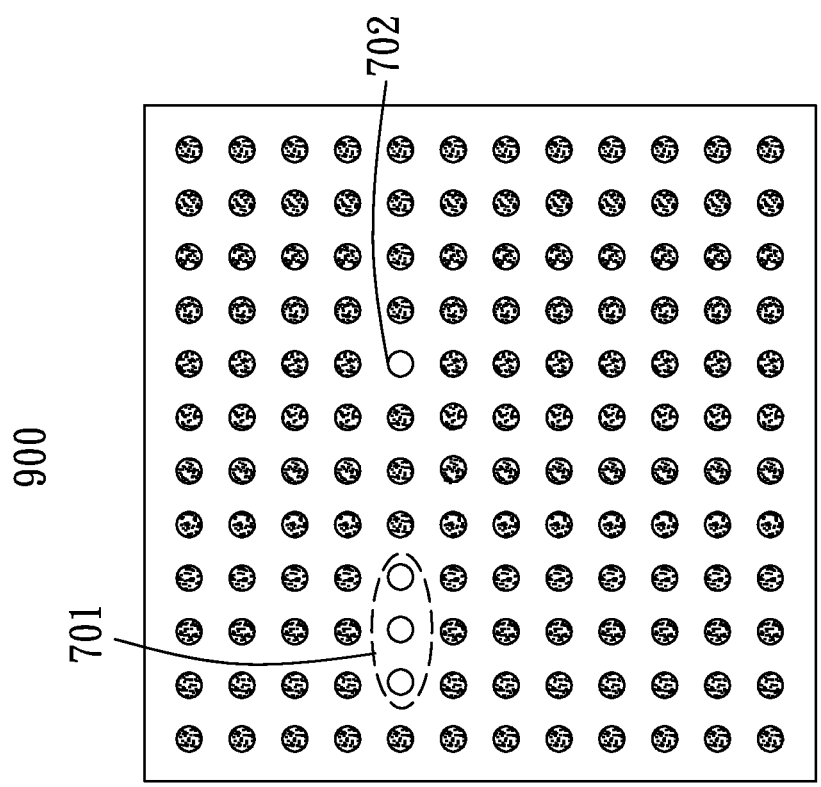
FIG. 9 illustrates a resultant image produced by adding images in FIG. 8.

FIG. 9 illustrates a combined image 900 for defect identification in accordance with an embodiment of the present invention. Image 900 is obtained by adding images 800(a) and 800(b), similarly to the formation of image 600(a) in FIG. 6. As shown, in image 900 plug-to-plug defect 701 can be distinguished from leakage defect 702, as defect 701 displays three successive observable BVCs while defect 702 still displays a single BVC. It is noted that for the purpose of inspecting plug-to-plug defect 701 subtraction of one of the images 800(a) and 800(b) from the other is also possible although not shown. The process and determination criteria are similar to that described in conjunction with image 600(b).

It is noted that in both the two-plug piping and three-plug piping cases described above, the observed abnormal plug patterns should be aligned on an axis simultaneously parallel to the two line-to-line advancement directions. In addition, among the identified abnormal plug patterns, there must be at least one abnormal plug pattern observed from each of the two images of inspection. For example, the first scanned plug along each of the two line-to-line advancement directions is certain to display a BVC, but the later scanned ones are not.

In the two-plug piping case a total of two abnormal plug patterns are eventually identified, as shown in images 600(a) and 600(b) of FIG. 6. With reference to FIG. 4, it can be seen that one of these two identified abnormal plug patterns in defect 401 is observed from the first grey level image, e.g., image 400(a) with the other being observed from the second grey level image, e.g., image 400(b).

On the other hand, in the three-plug piping case exemplified in FIG. 7 and FIG. 9, a total of three abnormal plug patterns are eventually identified (cf. FIG. 9). It can be seen that the left and right end abnormal plug patterns in defect 701 of FIG. 9 is observed from the first and second grey level images 700(a) and 700(b) of FIG. 7, respectively.

It is noted that in this embodiment, the center abnormal plug pattern in defect 701 is first identified as indistinct BVC in images 800(a) and 800(b), respectively. However, after images 800(a) and 800(b) are combined to produce the image of FIG. 9, this center abnormal plug pattern displays sharp BVC (cf. FIG. 9). This results from the effect of image processing, which one of ordinary skill in the art of image processing would understand, such as that described in conjunction with FIG. 6.

It is also noted that an abnormal plug pattern identified from one image of inspection may appear as a substantially normal plug pattern in the other. For example, the first scanned plug along the first line-to-line advancement direction will become the last scanned plug along the second line-to-line advancement direction if the second line-to-line advancement direction is parallel but opposite to the first line-to-line advancement direction. Therefore, this same plug pattern may display a BVC in the first grey level image but display a substantially normal or indistinct BVC in the second grey level image.

For example, in the two-plug piping case shown in FIG. 4, the left BVC plug pattern in image 400(a) displays a substantially normal, i.e., darker, grey level in image 400(b). Similarly, in the three-plug piping case shown in FIG. 7, the left end BVC plug pattern in image 700(a) displays a substantially normal grey level in image 700(b). The center (e.g., instinct) BVC plug pattern in image 700(a) could display substantially normal grey level or indistinct BVC in image 700(b), depending, for example, on the degree of environmental changes that occurs over the two imaging actions. In this embodiment, the center plug pattern displays the same grey level (e.g., an instinct BVC) in both images 700(a) and 700(b), or say 800(a) and 800(b), respectively, resulting from images 700(a) and 700(b).

Figure 10:
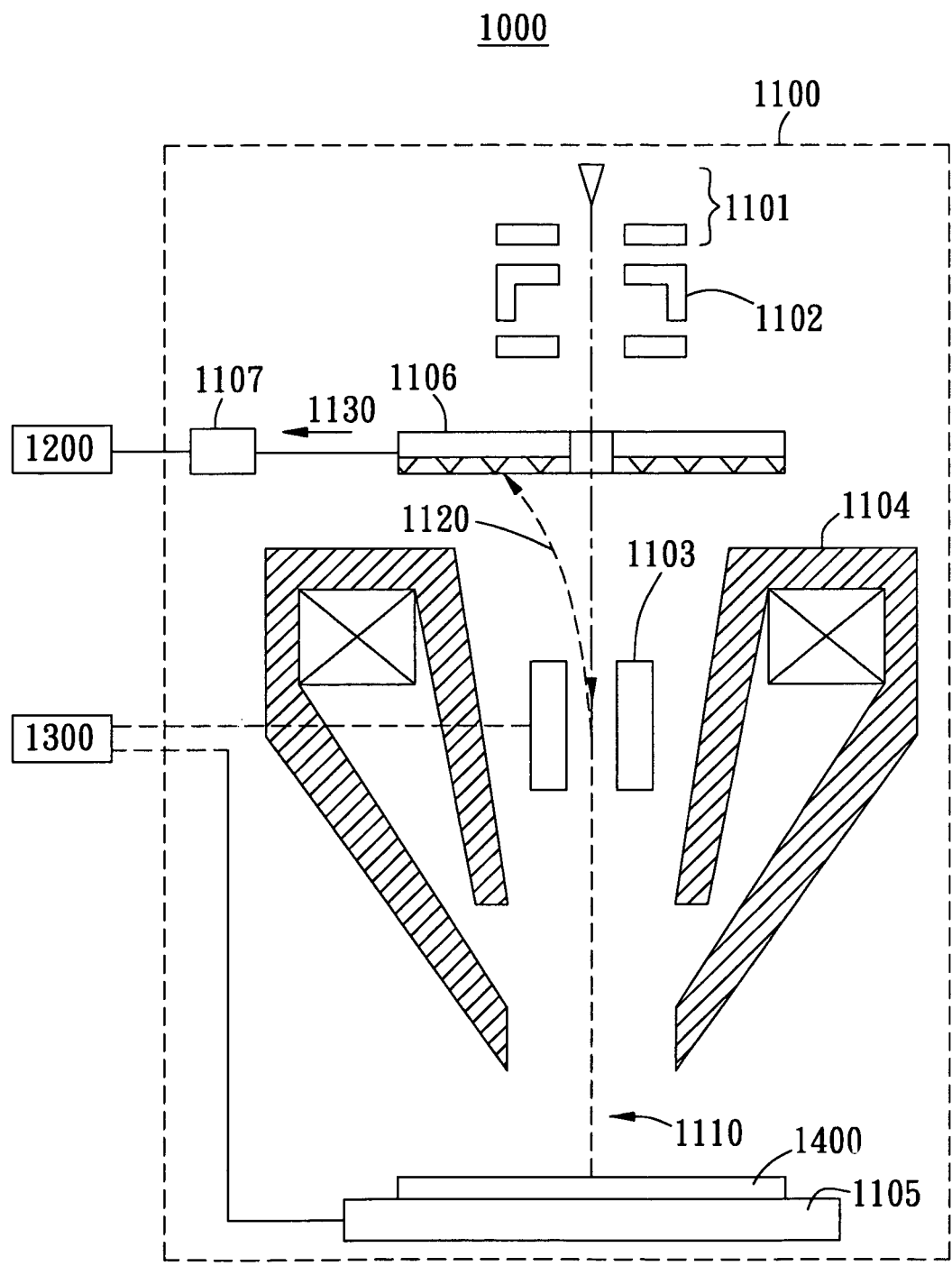
FIG. 10 is a schematic illustration of a charged particle beam inspection system in accordance with an embodiment of the present invention.

In one embodiment of the present invention, a charged particle beam inspection system is disclosed. The disclosed charged particle beam inspection system is designed to be able to identify the presence of a plug-to-plug short defect on a sample being inspected. Referring to FIG. 10, the disclosed charged particle beam inspection system 1000 comprises at least an image forming apparatus 1100, an image analysis apparatus 1200, and a control apparatus 1300. Image forming apparatus 1100 is for forming grey level images of a sample by means of scanning a charged particle beam over the sample. Image analysis apparatus 1200 is coupled to image forming apparatus 1100 for receiving the formed images therefrom. Control apparatus 1300 is coupled to image forming apparatus 1100 for controlling it to carry out the inspection. In one example, the charged particle beam is repeatedly line-scanned over the sample with a line-to-line advancement direction perpendicular to the line-scan direction. As mentioned earlier, this scan mode is generally referred to as the raster scan mode.

With such a configuration, the multi-directional scan image formation and associate image processing method described in the above embodiments in conjunction with FIG. 3 to FIG. 9 can be performed, for example, by image analysis apparatus 1200, thereby enabling charged particle beam inspection system 1000 to detect plug-to-plug short defects on a sample.

Image forming apparatus 1100 may be one similar to a conventional charged particle beam imaging device, such as a scanning electron beam microscope (SEM). For example, as shown, image forming apparatus 1100 may comprise a charged particle beam source 1101, a condenser lens module 1102, and an objective lens module 1104. Charged particle beam source 1101 generates a charged particle beam, and then the charged particle beam is condensed and focused by condenser lens module 1102 and objective lens module 1104, respectively, to form a charged particle beam probe 1110. The formed charged particle beam probe 1110 then bombards the surface of a sample 1400 secured on a stage 1105. Charged particle beam probe 1110 is controlled by a deflection module 1103 to scan the surface of sample 1400. After charged particle beam probe 1110 bombards the sample surface, secondary charged particles 1120 are induced to be emitted from the sample surface along with other charged particles of beam probe 1110 being reflected by the sample 1400. These particles are then detected and collected by a detector module 1106. Then, detector module 1106 generates a detection signal 1130 accordingly. An image forming module 1107 coupled to detector module 1106 then receives detection signal 1130 and accordingly forms a charged particle microscopic image, for example a grey level image, of sample 1400.

In one example, stage 1105 is movable. In such a case, control apparatus 1300 is coupled to stage 1105 and deflection module 1103, so that it coordinates stage 1105 and deflection module 1103, or it may coordinate the relative motion between charged particle beam probe 1110 and stage 1105, to carry out the line scan and line-to-line advancement of charged particle beam probe 1110. In one example, the charged particles are electrons.

While the invention is susceptible to various modifications and alternative forms, a specific example thereof has been shown in the drawings and herein described in detail. It should be understood, however, that the invention is not intended to be limited to the particular form disclosed, but to the contrary, the invention is intended to cover all modifications, equivalents, and alternatives falling within the spirit and scope of the appended claims.

What is claimed is:

1. A method of inspecting for plug-to-plug short defects on a sample of a semiconductor device by charged particle beam imaging where a charged particle beam is repeatedly line-scanned over said sample with a line-to-line advancement direction perpendicular to the line-scan direction, comprising:
    scanning said sample with line-to-line advancement along a first horizontal direction for obtaining a first grey level image of said sample;
    scanning said sample with line-to-line advancement along a second horizontal direction for obtaining a second grey level image of said sample, wherein said first grey level image and said second grey level image represent grey levels of a plurality of plug patterns on said sample;
    identifying abnormal plug patterns by identifying abnormal grey levels on said first grey level image and said second grey level image; and
    comparing said abnormal plug patterns in said first grey level image and said second grey level image to locate a plug-to-plug short defect on said sample.

2. The method of claim 1, wherein said first horizontal direction and second horizontal direction are parallel and opposite to each other.

3. The method of claim 2, wherein if said abnormal plug patterns, with at least one being identified within each of said first and second images, are aligned on an axis simultaneously parallel to said first and second directions, then it is determined that a plug-to-plug short defect is present on said sample, and otherwise it is determined that no plug-to-plug short defect is present on said sample.

4. The method of claim 3, wherein of said aligned at least two abnormal plug patterns, at least one identified from said first image displays a substantially normal grey level in said second image, and at least one identified from said second image displays a substantially normal grey level in said first image.

5. The method of claim 3, wherein said aligned at least two abnormal plug patterns are located between two parallel line patterns underneath the surface of said sample.

6. The method of claim 1, wherein said identifying step comprises respectively comparing said first and second images with a database layout of said sample.

7. The method of claim 6, wherein said database layout comprises one or more of a Graphic Data System (GDS) file of the sample and an Open Artwork System Interchange Standard (OASIS) file of the sample.

8. The method of claim 1, wherein said identifying step comprises respectively comparing said first grey level image and second grey level image with a reference grey level image of a reference semiconductor device having a same layout of patterns as said sample.

9. The method of claim 1, wherein said identifying step comprises:
respectively comparing said first grey level image and second grey level image with a predefined reference grey level image representing a same layout of patterns as said sample; and
said predefined reference image is produced by collectively considering at least one grey level image of the same layout of patterns as that on said sample.

10. The method of claim 1, wherein said identifying step comprises:
selecting, within each of said first and second images, two sets of repeating plug patterns; and
comparing, for each of said first and second images, said selected two sets of repeating plug patterns against each other pixel-by-pixel.

11. The method of claim 1, wherein said comparing step comprises linearly adding said first and second images.

12. The method of claim 1, wherein said comparing step comprises linearly subtracting one of said first and second images from the other.

13. The method of claim 1, wherein said plug patterns have a repeating layout.

14. The method of claim 1, wherein said sample comprises a NOR flash memory device, a dynamic random access memory (DRAM) device, or a static random access memory (SRAM) device.

15. A charged particle beam inspection system, comprising:
an image forming apparatus constructed to form grey level images of a sample by scanning charged particle beam repeatedly over said sample with a line-to-line advancement direction perpendicular to the line-scan direction;
an image analysis apparatus coupled to said image forming apparatus to receive said grey level images; and
a control apparatus coupled to said image forming apparatus to control said image forming apparatus to obtain a first grey level image of said sample by scanning said sample along a first horizontal direction and to obtain a second grey level image of said sample by scanning said sample along a second horizontal direction, wherein
said first grey level image and second grey level image represent grey levels of a plurality of plug patterns on said sample;
wherein said image analysis apparatus identifies abnormal plug patterns in said first grey level image and said second grey level image to locate a plug-to-plug short defect on said sample.

16. The charged particle beam inspection system of claim 15, wherein said first horizontal direction and second horizontal direction are parallel and opposite to each other.

17. The charged particle beam inspection system of claim 16, wherein said image analysis apparatus is configured to determine that a plug-to-plug short defect is present on said sample when abnormal plug patterns, with at least one being identifiable within each of said first and second images, are aligned on an axis simultaneously parallel to said first horizontal direction and second horizontal direction and otherwise to determine that no plug-to-plug short defect is present on said sample.

18. The charged particle beam inspection system of claim 17, wherein of said aligned abnormal plug patterns, at least one from said first grey level image displays a substantially normal grey level in said second grey level image, and at least one from said second grey level image displays a substantially normal grey level in said first grey level image.

19. The charged particle beam inspection system of claim 17, wherein said aligned abnormal plug patterns are located between two parallel line patterns in locations that are one or more of on said sample and underneath the surface of said sample.

20. The charged particle beam inspection system of claim 15, wherein said image forming apparatus comprises:
a beam deflection module for deflecting, and thereby scanning, said charged particle beam over said sample; and
a stage whereupon said sample is secured when being scanned;
wherein said control apparatus being coupled with and configured to coordinate said beam deflection module and said stage to perform the line-to-line advancement during scanning of said charged particle beam.

* * * * *